(12) United States Patent
Kruppa et al.

(10) Patent No.: US 8,445,836 B2
(45) Date of Patent: May 21, 2013

(54) SYSTEM FOR MAINTAINING AN EVEN TEMPERATURE DISTRIBUTION ACROSS A LASER DETECTOR

(75) Inventors: Victor D. Kruppa, Tucson, AZ (US); Richard A. Schmidt, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 538 days.

(21) Appl. No.: 12/717,434

(22) Filed: Mar. 4, 2010

(65) Prior Publication Data

US 2011/0215232 A1    Sep. 8, 2011

(51) Int. Cl.
*H01J 7/24* (2006.01)
*H01J 40/14* (2006.01)

(52) U.S. Cl.
USPC .......... 250/238; 250/214.1; 257/467; 372/34

(58) Field of Classification Search
USPC .......... 250/238, 214.1, 214 R; 257/734–738, 257/467–470; 372/34
See application file for complete search history.

(56) References Cited

U.S. PATENT DOCUMENTS

| 4,733,609 | A  | 3/1988 | Goodwin et al. |
| 6,534,859 | B1 | 3/2003 | Shim et al. |

FOREIGN PATENT DOCUMENTS

| WO | WO-20060170101 A1 | 8/2006 |
| WO | WO-20080158041 A1 | 7/2008 |
| WO | WO-20080197274 A1 | 8/2008 |
| WO | WO-20100025592 A1 | 2/2010 |

OTHER PUBLICATIONS

"International Application Serial No. PCT/US2011/000392, International Search Report and Written Opinion mailed May 5, 2011", 8 pgs.

"Application Serial No. PCT/US2011/000392,International Preliminary Report on Patentability mailed Sep. 13, 2012", 7 pgs.

*Primary Examiner* — Francis M Legasse, Jr.
(74) *Attorney, Agent, or Firm* — Schwegman Lundberg & Woessner, P.A.

(57) ABSTRACT

Embodiments of a system to maintain an even temperature distribution across a laser detector are generally described herein. In some embodiments, the system includes a multi-layer printed circuit board (PCB) assembly that includes a first layer comprising a thermally-conductive ring provided circumferentially around a thermally-conductive detector region for mounting the laser detector, a second layer comprising a plurality of resistive elements aligned with the thermally-conductive detector region to generate heat, and a fourth layer comprising a thermally-conductive heat-distribution region aligned with the thermally-conductive detector region. A plurality of thermally-conductive vias is provided to couple the thermally-conductive ring of the first layer to the thermally-conductive heat-distribution region of the fourth layer. The thermally-conductive vias transfer heat between the thermally-conductive heat-distribution region and the thermally-conductive ring to provide an even distribution of heat across the laser detector.

22 Claims, 4 Drawing Sheets

SECOND AND THIRD LAYERS

FOURTH LAYER

CAGE

SYSTEM FOR MAINTAINING AN EVEN TEMPERATURE DISTRIBUTION ACROSS A LASER DETECTOR

TECHNICAL FIELD

Embodiments pertain to systems that use laser detectors. Some embodiments pertain to multi-layer printed circuit board (PCB) assemblies. Some embodiments pertain to maintaining an even temperature distribution across a laser detector. Some embodiments pertain to guided projectiles that use laser detectors.

BACKGROUND

One issue with systems that use laser detectors is that low temperature and temperature variation across the surface of a laser detector reduces the sensitivity of the laser detector. This, for example, may reduce the range of a guided projectile that relies on laser detection for targeting. Thus, what is needed is a system that provides a stable temperature and a more even temperature distribution across the surface of a laser detector.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
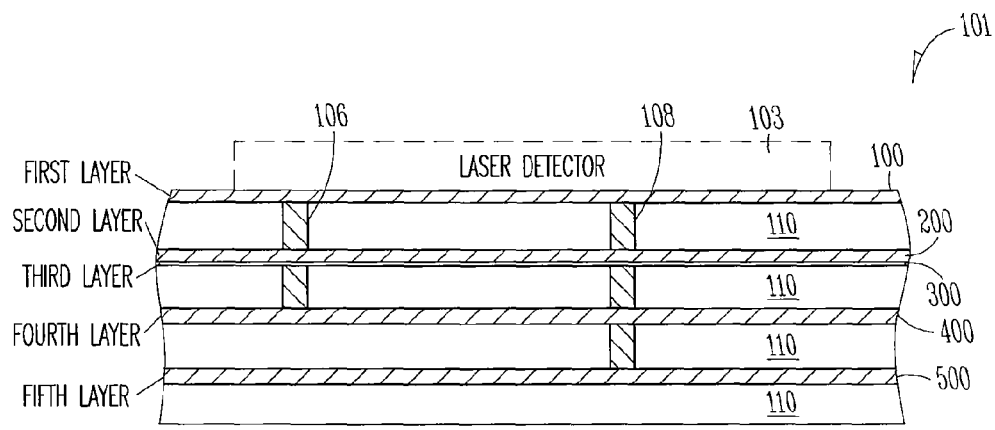
FIG. 1 is a multi-layer printed circuit board (PCB) assembly in accordance with some embodiments.

FIG. 1 is a multi-layer printed circuit board (PCB) assembly in accordance with some embodiments. The multi-layer PCB assembly 101 may be configured to maintain an even distribution of heat across a laser detector 103 provided thereon. In these embodiments, the multi-layer PCB assembly 101 may include a first layer 100, a second layer 200, a third layer 300, a fourth layer 400 and a fifth layer 500. In some embodiments, the multi-layer PCB assembly 101 may be part of a system for maintaining an even distribution of heat across the laser detector 103.

The first layer 100 may include a thermally-conductive ring and a thermally-conductive detector region for mounting the laser detector 103 thereon. The second layer 200 may comprise a plurality of resistive elements aligned with the thermally-conductive detector region to generate heat. The third layer 300 may have elements to provide electrical energy to the resistive elements. The fourth layer 400 may include a thermally-conductive heat-distribution region aligned with the thermally-conductive detector region. The fifth layer 500 may have additional circuitry disposed thereon.

In these embodiments, the multi-layer PCB assembly 101 may include a plurality of thermally-conductive vias 106 coupling the thermally-conductive ring of the first layer 100 to the thermally-conductive heat-distribution region of the fourth layer 400. The thermally-conductive vias 106 are provided through the multi-layer PCB assembly 101 to transfer heat between the thermally-conductive heat-distribution region and the thermally-conductive ring. In these embodiments, the thermally-conductive ring and the thermally-conductive vias 106 contain heat within a localized region of the multi-layer PCB assembly 101 that includes the laser detector 103. These embodiments are described in more detail below.

In some embodiments, the multi-layer PCB assembly 101 may include plated-thru vias 108 to couple circuitry on the fifth layer 500 with circuitry on the first layer 100 and the third layer 300. The layers of the multi-layer PCB assembly may comprise an insulating substrate 110 that may be fabricated from a conventional circuit board material including a ceramic or a laminate such as a glass-reinforced or composite laminate. Examples of laminate may include FR-4 or Poly-Tetra-Fluoro-Ethylene (PTFE). For clarity, FIG. 1 shows only a single thermally-conductive via 106 and a single plated-thru via 108.

Figure 2:
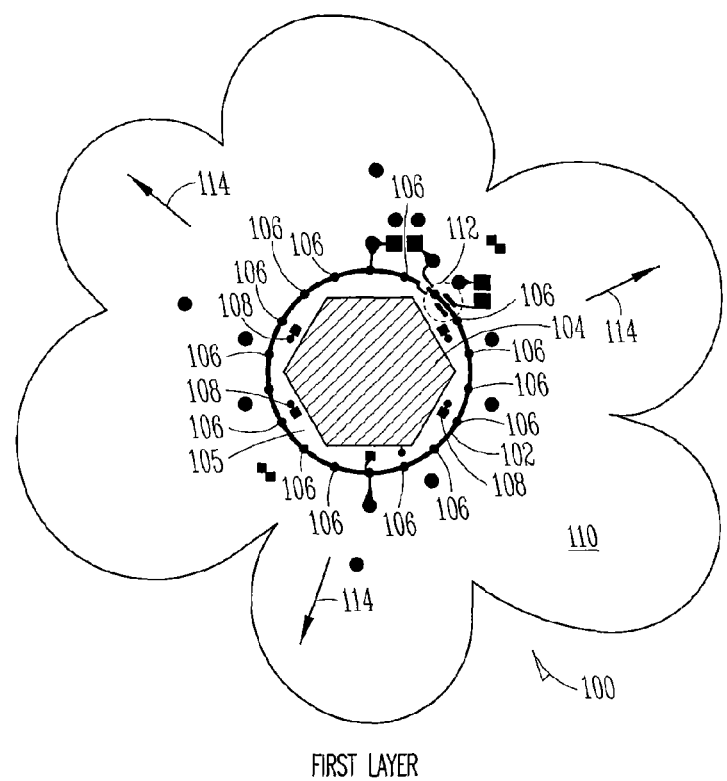
FIG. 2 illustrates a first layer of the multi-layer PCB assembly of FIG. 1 in accordance with some embodiments.

FIG. 2 illustrates the first layer 100 of the multi-layer PCB assembly 101 (FIG. 1) in accordance with some embodiments. The first layer 100 may comprise a thermally-conductive ring 102 provided circumferentially around a thermally-conductive detector region 104 for mounting the laser detector 103 (FIG. 1) thereon. The thermally-conductive vias 106 are illustrated as darkened spots on the thermally-conductive ring 102. The first layer 100 may be fabricated on insulating substrate 110.

Figure 3:
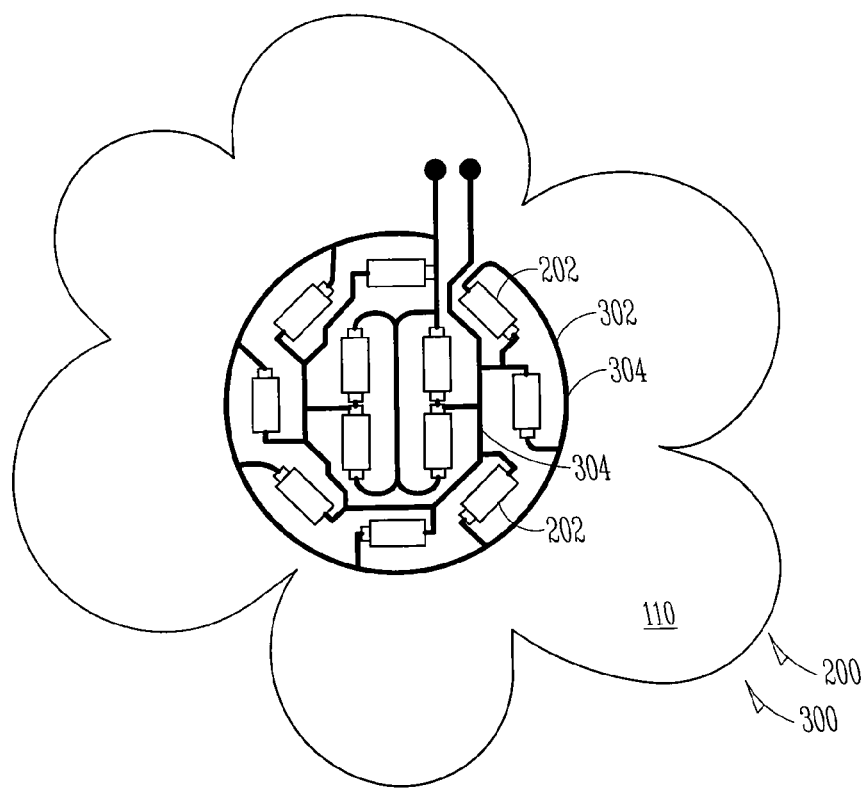
FIG. 3 illustrates second and third layers of the multi-layer PCB assembly of FIG. 1 in accordance with some embodiments.

FIG. 3 illustrates the second and third layers of the multi-layer PCB assembly 101 (FIG. 1) in accordance with some embodiments. The second layer 200 may comprise a plurality of resistive elements 202 which are to be aligned with the thermally-conductive detector region 104 (FIG. 2) to generate heat. The second layer 200 may also include power circuitry. The third layer 300 may include power traces 304 including a power trace ring 302 to provide electrical energy to the resistive elements 202 of the second layer 200.

Figure 4:
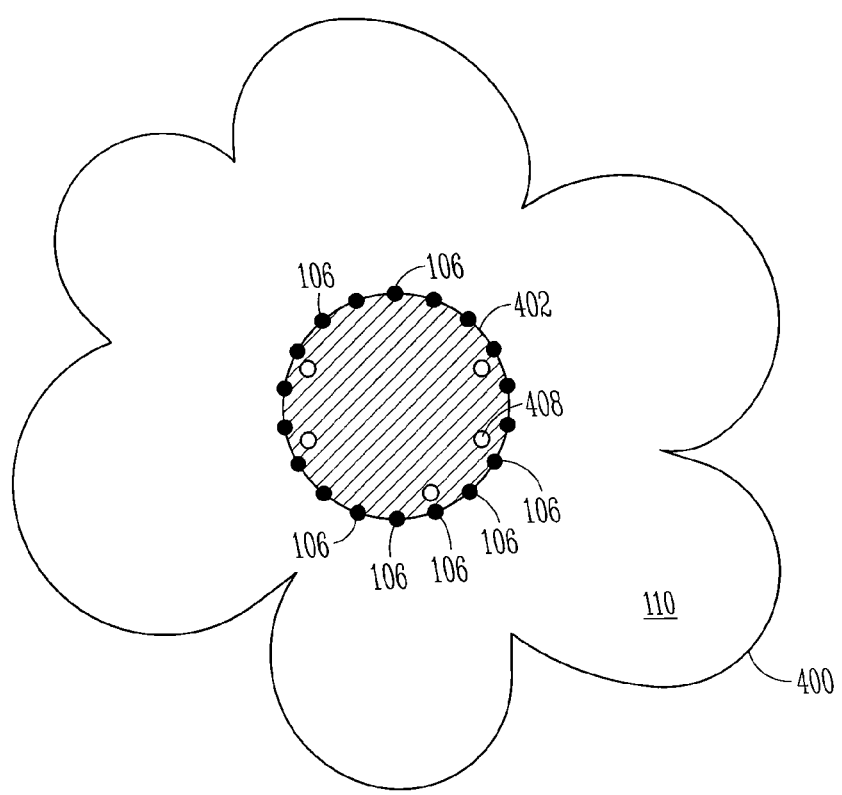
FIG. 4 illustrates a fourth layer of the multi-layer PCB assembly of FIG. 1 in accordance with some embodiments.

FIG. 4 illustrates the fourth layer of the multi-layer PCB assembly 101 (FIG. 1) in accordance with some embodiments. The fourth layer 400 may comprise a thermally-conductive heat-distribution region 402 which is to be aligned with the thermally-conductive detector region 104 (FIG. 1). The thermally-conductive vias 106 are illustrated as darkened spots around the perimeter of the thermally-conductive heat-distribution region 402.

In referring to FIGS. 1 through 4 together, the multi-layer PCB assembly 101 (FIG. 1) is configured to maintain an even distribution of heat across the laser detector 103 (FIG. 1) provided thereon. The plurality of thermally-conductive vias 106 coupled to the thermally-conductive ring 102 (FIG. 2) and to the thermally-conductive heat-distribution region 402 (FIG. 4) are provided through the multi-layer PCB assembly 101 to transfer heat between the thermally-conductive heat-distribution region 402 and the thermally-conductive ring 102. In these embodiments, the thermally-conductive ring 102 and the thermally-conductive vias 106 contain heat within a localized region 105 (FIG. 1) of the multi-layer PCB assembly 101 that includes the laser detector 103.

In some embodiments, the thermally-conductive heat-distribution region 402 may absorb heat generated by the resistive elements 202 and help evenly distribute heat to the laser detector. In these embodiments, the thermally-conductive vias 106 provide a thermal conduction path between the thermally-conductive heat-distribution region 402 and the thermally-conductive ring 102 reducing heat leakage through the multi-layer PCB assembly 101 to the perimeter 114 of the multi-layer PCB assembly 101. This is beneficial particularly when operating in a cold environment.

In some embodiments, the thermally-conductive heat-distribution region 402 may help evenly distribute heat generated by the resistive elements 202 across the surface of the laser detector 103 by reducing a temperature variation across the thermally-conductive detector region 104. The thermally-conductive heat-distribution region 402, thermally-conductive vias 106 and thermally-conductive ring 102 helps prevent hot and cold spots on the thermally-conductive detector region 104 reducing the temperature variation across the surface of the laser detector 103. Without the use of the thermally-conductive heat-distribution region 402, thermally-conductive vias 106 and thermally-conductive ring 102, hot and cold spots may result on the thermally-conductive detector region 104 resulting in hot and cold spots on the laser detector 103 reducing the effectiveness of the laser detector 103.

Figure 5:
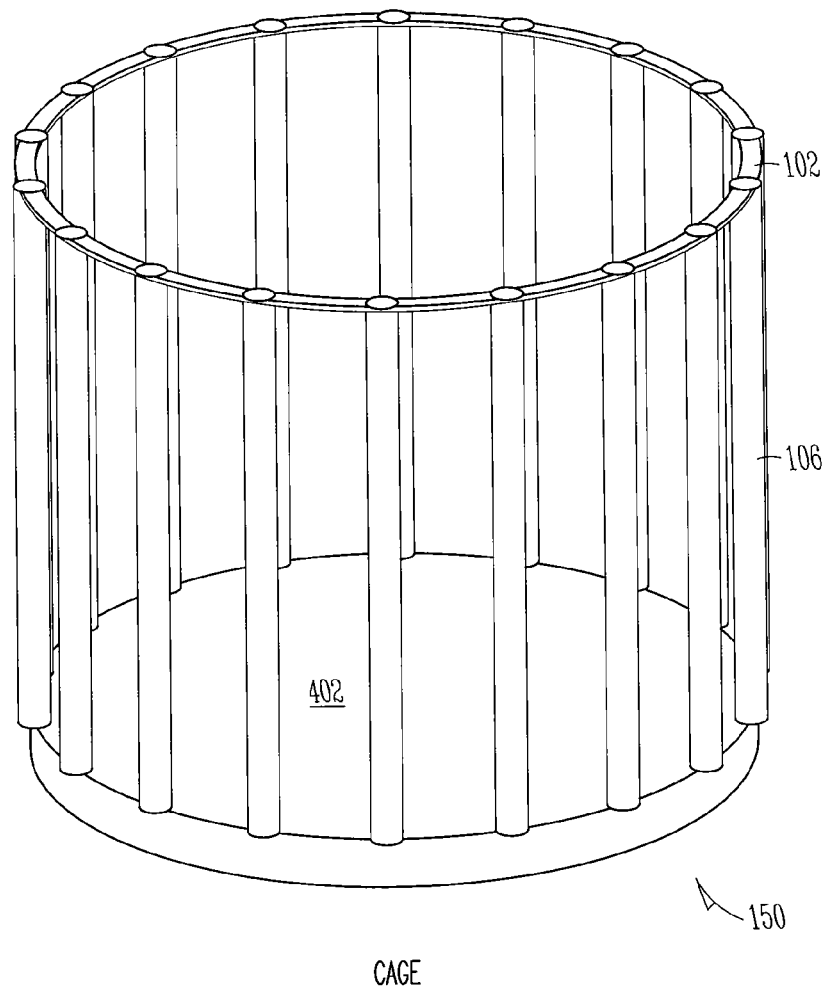
FIG. 5 illustrates a cage for heat distribution in accordance with some embodiments.

In some embodiments, the plurality of thermally-conductive vias 106 are provided substantially in a circle forming a cage to couple the thermally-conductive ring 102 to a perimeter of the thermally-conductive heat-distribution region 402. The cage may help evenly distribute the heat generated by the resistive elements 202 across a surface of the laser detector 103. An example of a cage is illustrated in FIG. 5 discussed below.

In some embodiments, the thermally-conductive detector region 104 may be a detector mounting plate. In some embodiments that use a hexagonal-shaped laser detector, the thermally-conductive detector region 104 may be hexagonal-shaped for mounting the laser detector 103 thereon as illustrated in FIG. 2. In these embodiments, the thermally-conductive heat-distribution region 402 of the fourth layer 400 may comprise a circular conductive region as illustrated in FIG. 4 that is aligned with and larger than the thermally-conductive detector region 104. In these embodiments, the plurality of thermally-conductive vias 106 may be provided in a circle as illustrated in FIG. 2 coupling the thermally-conductive ring 102 through the multi-layer PCB assembly 101 to the perimeter of thermally-conductive heat-distribution region 402.

In some embodiments, the plurality of resistive elements 202 generates heat to maintain the laser detector 103 within a predetermined temperature range. In some embodiments, a temperature sensor may be provided to determine the temperature of the laser detector 103 and control circuitry may be used to control the plurality of resistive elements 202 to maintain the laser detector 103 within the predetermined temperature range. In these embodiments, the temperature sensor may be provided at temperature sensor area 112 (FIG. 2), although this is not a requirement.

In some embodiments, the temperature of the laser detector 103 may be maintained at or near its optimal temperature for improved sensitivity. In some embodiments, the laser detector 103 may be heated to within a predetermined temperature (e.g., around 50 deg C.) when operating in a cold environment and the multi-layer PCB assembly 101 may reduce the temperature variation across the face of the laser detector 103.

In some embodiments, the laser detector 103 may be a semi-active laser detector. In these embodiments, the multi-layer PCB assembly 101 and the laser detector 103 may be part of a guided projectile (e.g., a missile, bomb, etc.) that includes a laser seeker. In these embodiments, a laser may be aimed at a target and the laser seeker may determine a direction to the target based on reflected laser energy from the target and may adjust the projectile's trajectory toward the target.

The thermally-conductive ring 102, the thermally-conductive detector region 104, thermally-conductive vias 106 as well as other thermally and electrically conductive elements may comprise copper or a copper alloy, although this is not a requirement as other thermally-conductive materials such as gold, aluminum, nickel, tin or solder may be used. In some embodiments, the thermally-conductive heat-distribution region 402 comprises a thick layer of copper. The thick layer of copper may be one-ounce copper. Other layers may use half-ounce copper although this is not a requirement. The thermally-conductive vias 106 may comprise plated-thru vias fabricated with a conventional circuit-board fabrication technique.

In some embodiments, the first layer 100 may be a top layer and may include signal, control and power circuitry. The second layer 200 may be a resistor-element layer and may include resistive elements 202. The third layer 300 may be a power-circuitry layer to provide power to the second layer. The fourth layer 400 may be a thermal-distribution layer, and the fifth layer 500 (FIG. 1) may be a circuitry layer although this is not a requirement. Signals from the laser detector 103, for example, may be provided from the first layer 100 to the fifth layer 500 using plated-thru vias 108.

In FIG. 3, the thermally-conductive vias 106 may pass through the inside of the power trace ring 302 of the third layer 300 to couple the thermally-conductive ring 102 of the first layer 100 with the thermally-conductive heat-distribution region 402 of the fourth layer 400. The thermally-conductive vias 106 do not need to pass through the entire multi-layer PCB assembly 101 as illustrated in FIG. 1. In FIG. 4, holes 408 may be provided in the thermally-conductive heat-distribution region 402 to allow signals to pass through layer 400 without connecting to the thermally-conductive heat-distribution region 402.

FIG. 5 illustrates a cage 150 for heat distribution in accordance with some embodiments. In these embodiments, the thermally-conductive vias 106 couple the thermally-conductive ring 102 of the first layer 100 (FIG. 2) to the thermally-conductive heat-distribution region 402 of the fourth layer 400 (FIG. 4). The cage 150 provides for heat distribution and dissipation as discussed above. The cage 150 may contain heat within a localized region 105 (FIG. 2) of the multi-layer PCB assembly 101 that includes the laser detector 103 (FIG. 1). The thermally-conductive vias 106 are provided through the multi-layer PCB assembly 101 to transfer heat between the thermally-conductive heat-distribution region 402 and the thermally-conductive ring 102 to reduce temperature variation across the laser detector 103 (FIG. 1). The thermally-conductive vias 106 may also transfer heat between the thermally-conductive heat-distribution region 402 and the thermally-conductive ring 102 to aid in reducing the heat dissipation to the perimeter 114 (FIG. 2) of the multi-layer PCB assembly 101 thus flooding the area with heat flux to help in reducing temperature variation across the laser detector 103.

In some embodiments, a system for maintaining an even distribution of heat across a laser detector is provided. In these embodiments, the system may comprise a multi-layer PCB assembly, such as multi-layer PCB assembly 101, described above. In some embodiments, the system may comprise a thermally-conductive ring provided circumferentially around a thermally-conductive detector region for mounting the laser detector thereon. The system may also comprise one or more heat-generating elements, and a thermally-conductive heat-distribution region aligned with the thermally-conductive detector region. The system may also comprise a plurality of thermally-conductive shafts coupling the thermally-conductive ring to the thermally-conductive heat-distribution region. The thermally-conductive shafts transfer heat between the thermally-conductive heat-distribution region and the thermally-conductive ring to reduce temperature variation across the laser detector.

In some embodiments, the plurality of thermally-conductive shafts may be provided substantially in a circle forming a cage 150 to couple the conductive ring to a perimeter of the thermally-conductive heat-distribution region, the cage to help evenly distribute the heat generated by the one or more heat-generating elements across a surface of the laser detector. In some embodiments, an insulating substrate material may be provided between the thermally-conductive ring and the one or more heat-generating elements, and provided between the one or more heat-generating elements and the thermally-conductive heat-distribution region aligned with the thermally-conductive detector region. The plurality of thermally-conductive shafts may be provided through the insulating substrate material to couple the thermally-conductive ring to the thermally-conductive heat-distribution region.

In some of these embodiments, the system may also include a temperature sensor and feedback circuitry to maintain the temperature laser detector within a predetermined temperature range. When the system is configured to be located on a guided projectile, the predetermined temperate range is between 45 and 55 degrees Celsius, although this is not a requirement.

In some embodiments, a thermal containment and thermal-balancing structure is provided. In these embodiments, the structure may comprise a plurality of PCB layers that form a cage, such as cage 150, to evenly distribute heat across a surface of a laser detector.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A system to maintain an even distribution of heat across a laser detector, the system including a multi-layer printed circuit board (PCB) assembly having at least first, second and fourth layers, the system comprising:
   the first layer comprising a thermally-conductive ring provided circumferentially around a thermally-conductive detector region for mounting the laser detector thereon;
   the second layer comprising a plurality of resistive elements aligned with the thermally-conductive detector region to generate heat;
   the fourth layer coupled along the second layer, the fourth layer comprising a thermally-conductive heat-distribution region aligned with the thermally-conductive detector region, and the thermally-conductive heat-distribution region of the fourth layer absorbs heat generated by the resistive elements of the second layer coupled along the fourth layer; and
   a plurality of thermally-conductive vias coupling the thermally-conductive ring to the thermally-conductive heat-distribution region,
   wherein the thermally-conductive vias are provided through the multi-layer PCB assembly to transfer heat absorbed in the thermally-conductive heat distribution region from the resistive elements between the thermally-conductive heat-distribution region and the thermally-conductive ring.

2. The system of claim 1 wherein the thermally-conductive heat-distribution region is to help evenly distribute heat to the laser detector.

3. The system of claim 1 wherein the plurality of resistive elements is to generate heat to maintain the laser detector within a predetermined temperature range.

4. The system of claim 1 wherein the thermally-conductive heat-distribution region comprises a thick layer of copper.

5. The system of claim 1 further comprising:
   a third layer to provide electrical energy to the resistive elements; and
   a fifth layer having circuitry thereon,
   wherein the multi-layer PCB assembly further comprises plated-thru vias to couple circuitry on the fifth layer with circuitry on the first layer and the third layer.

6. The system of claim 1 wherein the thermally-conductive ring, the thermally-conductive vias and the thermally-conductive heat-distribution region form a cage to help evenly distribute the heat generated by the resistive elements across a surface of the laser detector.

7. The system of claim 1 comprising an insulating substrate material layer interposed between the first layer including the thermally-conductive ring and the second layer including the plurality of resistive elements.

8. The system of claim 1, wherein the thermally-conductive ring includes a ring outer perimeter and a ring inner perimeter, and the ring inner and outer perimeters are provided circumferentially around the thermally-conductive detector region.

9. The system of claim 2 wherein the thermally-conductive heat-distribution region is to help evenly distribute heat generated by the resistive elements across a surface of the laser detector and to help reduce a temperature variation across the thermally-conductive detector region.

10. The system of claim 9 wherein the plurality of thermally-conductive vias are provided substantially in a circle to couple the conductive ring to a perimeter of the thermally-conductive heat-distribution region through the multi-layer PCB assembly.

11. The system of claim 4 wherein the thick layer of copper comprises one-ounce copper, and
   wherein the thermally-conductive vias comprise plated-thru vias fabricated with a conventional circuit-board fabrication technique.

12. A system to maintain a substantially even temperature distribution across a laser detector, the system comprising:
   a thermally-conductive ring having a ring outer perimeter and a ring inner perimeter, and the ring inner and outer perimeters are provided circumferentially around a thermally-conductive detector region for mounting the laser detector thereon;
   one or more heat-generating elements separated from the thermally conductive ring by an insulating substrate material layer;
   a thermally-conductive heat-distribution region aligned with the thermally-conductive detector region, the thermally-conductive heat-distribution region coupled along the one or more heat-generating elements; and
   a plurality of thermally-conductive shafts coupling the thermally-conductive ring to the thermally-conductive heat-distribution region, the plurality of thermally-conductive shafts coupled with the thermally-conductive ring between the ring inner and outer perimeters, wherein the thermally-conductive shafts are to transfer heat absorbed from the one or more heat-generating elements by the thermally-conductive heat-distribution region between the thermally-conductive heat-distribution region and the thermally-conductive ring to reduce temperature variation across the laser detector.

13. The system of claim 12 wherein the plurality of thermally-conductive shafts are provided substantially in a circle forming a cage to couple the conductive ring to a perimeter of the thermally-conductive heat-distribution region, the cage to help evenly distribute the heat generated by the one or more heat-generating elements across a surface of the laser detector.

14. The system of claim 13
wherein the plurality of thermally-conductive shafts are provided through the insulating substrate material layer to couple the thermally-conductive ring to the thermally-conductive heat-distribution region.

15. The system of claim 14 further comprising a temperature sensor and feedback circuitry to maintain the temperature laser detector within a predetermined temperature range.

16. The system of claim 15 wherein the system is configured to be located on a guided projectile, and
wherein the predetermined temperate range is between 45 and 55 degrees Celsius.

17. A thermal containment and thermal-balancing structure comprising:
a plurality of printed-circuit board (PCB) layers that include a plurality of thermally-conductive vias extending through the layers that form a cage to evenly distribute heat across a laser detector, wherein the layers of the PCB include:
a top layer comprising a thermally-conductive ring, the thermally-conductive ring including a ring outer perimeter and a ring inner perimeter, the ring inner and outer perimeters provided circumferentially around a thermally-conductive detector region,
a heat generating layer comprising a plurality of resistive elements, and
a thermal-distribution layer coupled along the heat generating layer, the thermal-distribution layer comprising a thermally-conductive heat-distribution region aligned with the thermally-conductive detector region, and the thermally-conductive heat-distribution region of the fourth layer absorbs heat generated by the heat generating layer; and
wherein the plurality of thermally-conductive vias couple the thermally-conductive ring to a perimeter of the thermally-conductive heat-distribution region, and the thermally-conductive vias transfer heat absorbed in the thermally-conductive heat distribution region between the thermally-conductive heat-distribution region and the thermally-conductive ring.

18. The thermal containment and thermal-balancing structure of claim 17 wherein the thermally-conductive ring comprises one-half ounce copper and the thermally-conductive heat-distribution region comprises one-ounce copper.

19. The thermal containment and thermal-balancing structure of claim 18 wherein the plurality of resistive elements include a resistor-element layer to generate heat, the resistor layer provided between the top layer and the thermal distribution layer.

20. The thermal containment and thermal-balancing structure of claim 19 wherein the thermally-conductive vias are provided through the PCB layers to transfer heat between the thermally-conductive heat-distribution region and the thermally-conductive ring to provide a substantially even temperature distribution across a surface of the laser detector.

21. A system to maintain an even distribution of heat across a laser detector, the system including a multi-layer printed circuit board (PCB) assembly having at least first, second and fourth layers, the system comprising:
the first layer comprising a thermally-conductive ring provided circumferentially around a thermally-conductive detector region for mounting the laser detector thereon, the ring including a ring inner perimeter and a ring outer perimeter, and the thermally-conductive detector region is within the ring inner and outer perimeters;
the second layer comprising a plurality of resistive elements aligned with the thermally-conductive detector region to generate heat;
the fourth layer coupled along the second layer, the fourth layer comprising a thermally-conductive heat-distribution region aligned with the thermally-conductive detector region, and the thermally-conductive heat-distribution region of the fourth layer absorbs heat generated by the resistive elements of the second layer coupled along the fourth layer; and
a plurality of thermally-conductive vias coupling the thermally-conductive ring to the thermally-conductive heat-distribution region, the thermally-conductive vias are coupled with the thermally-conductive ring between the ring inner and outer perimeters, and the plurality of thermally-conductive vias are arranged in a ring corresponding to the thermally-conductive ring,
wherein the thermally-conductive vias extend through the multi-layer PCB assembly to transfer heat between the thermally-conductive heat-distribution region and the thermally-conductive ring, wherein the heat is initially absorbed in the thermally-conductive heat distribution region from the resistive elements.

22. The system of claim 21 comprising an insulating substrate material layer interposed between the first layer including the thermally-conductive ring and the second layer including the plurality of resistive elements.

* * * * *